United States Patent
Son et al.

(10) Patent No.: US 10,468,581 B2
(45) Date of Patent: Nov. 5, 2019

(54) METHOD AND APPARATUS FOR DRIVING PIEZO ACTUATOR

(71) Applicant: MPLUS CO., LTD., Suwon-si, Gyeonggi-do (KR)

(72) Inventors: Yeon Ho Son, Suwon-si (KR); Dong Su Moon, Suwon-si (KR); Kyung Su Park, Suwon-si (KR); Joon Choi, Suwon-si (KR); Jung Hyun Park, Suwon-si (KR)

(73) Assignee: MPLUS CO., LTD., Suwon-si, Gyeonggi-Do (KR)

( * ) Notice: Subject to any disclaimer, the term of this patent is extended or adjusted under 35 U.S.C. 154(b) by 489 days.

(21) Appl. No.: 15/208,727

(22) Filed: Jul. 13, 2016

(65) Prior Publication Data
US 2017/0047501 A1 Feb. 16, 2017

(30) Foreign Application Priority Data

Aug. 12, 2015 (KR) .................. 10-2015-0113988

(51) Int. Cl.
*H01L 41/04* (2006.01)
(52) U.S. Cl.
CPC .................. *H01L 41/042* (2013.01)
(58) Field of Classification Search
CPC .......................... H01L 41/042; H01L 41/0953
USPC ......................................................... 310/317
See application file for complete search history.

(56) References Cited

U.S. PATENT DOCUMENTS

| | | | |
|---|---|---|---|
| 2005/0116583 A1* | 6/2005 | Nishio | H02N 2/008 310/317 |
| 2008/0278032 A1* | 11/2008 | Adachi | H02N 2/004 310/317 |

FOREIGN PATENT DOCUMENTS

| | | |
|---|---|---|
| CN | 1913323 A | 2/2007 |
| JP | 2003-304693 A | 10/2003 |
| KR | 2007-0017709 A | 2/2007 |

OTHER PUBLICATIONS

SIPO Office Action for Chinese Application No. 201610657588.7 dated Jan. 31, 2018 which corresponds to the above-referenced U.S. application.
Zhang Yi Song et al., "An application of Piezoelectric Ceramics in Vibration Test", Journal of Experimental Mechanics, Jun. 1987.

* cited by examiner

*Primary Examiner* — Derek J Rosenau
(74) *Attorney, Agent, or Firm* — LRK Patent Law Firm

(57) ABSTRACT

A method for driving a piezo actuator includes detecting consumption current by stepwise sweeping the frequency of an actuator driving signal to drive the piezo actuator vibrated in response to first and second vibration modes from a first reference frequency and determining a frequency at which the consumption current is inflected to be a first resonant frequency, detecting consumption current by stepwise sweeping the frequency of the actuator driving signal from a second reference frequency and determining a frequency at which the consumption current is inflected to be a second resonant frequency, and outputting an actuator driving signal in response to the first resonant frequency and the second resonant frequency.

9 Claims, 7 Drawing Sheets

METHOD AND APPARATUS FOR DRIVING PIEZO ACTUATOR

CROSS REFERENCE TO RELATED APPLICATION

The present application claims the benefit of Korean Patent Application. No. 10-2015-0113988 filed in the Korean Intellectual Property Office on Aug. 12, 2015, the entire content of which is incorporated herein by reference.

BACKGROUND OF THE INVENTION

1. Technical Field

The present invention relates to a method and apparatus for driving a piezo actuator.

2. Description of the Related Art

In portable electronic devices, a vibrator is used for various purposes.

Recently, a vibrator using a piezoelectric element having low-noise and low-power characteristics, that is, a piezo actuator, is used. The piezo actuator is based on the principle of an inverse piezoelectric effect that generates displacement by applying a voltage to the piezoelectric element, and is a device using the principle that a vibration power is generated by moving the weight body of the vibrator by the generated displacement.

The piezo actuator may be implemented in the form of a dual frequency actuator having two resonant points. Such an actuator may not provide a sufficient amount of vibration because it may have a cantilever structure unlike an actuator whose both ends are supported.

PRIOR ART DOCUMENT

Patent Document (Patent Document. 1) Korean Patent Application Publication No. 2007-0017709

(Patent Document 2) Japanese Patent Application Publication No. 2003-304693

SUMMARY OF THE INVENTION

In accordance with an embodiment of the present invention, there are provided a method and apparatus for driving a piezo actuator, wherein a piezo actuator is driven to provide a sufficient vibration power determining a resonant frequency according to a plurality of vibration modes.

In accordance with an embodiment of the present invention, there provided a method for driving a piezo actuator, including detecting consumption current by stepwise sweeping the frequency of an actuator driving signal to drive the piezo actuator vibrated in response to first and second vibration modes from a first reference frequency and determining a frequency at which the consumption current is inflected to be a first resonant frequency, detecting consumption current by stepwise sweeping the frequency of the actuator driving signal from a second reference frequency and determining a frequency at which the consumption current is inflected to be a second resonant frequency, and outputting an actuator driving signal in response to the first resonant frequency and the second resonant frequency.

In accordance with another embodiment of the present invention, there is provided an apparatus for driving a piezo actuator, including a piezo actuator deformed in response to first and second vibration modes, an actuator driver configured to output an actuator driving signal to drive the piezo actuator, a current detector configured to detect the consumption current of the actuator driver, a frequency controller configured to determine a first resonant frequency and a second resonant frequency based on a frequency at which the consumption current is inflected and to output a frequency control signal, and a frequency changer configured to output a driving control signal to the actuator driver in response to the frequency control signal.

DETAILED DESCRIPTION

Some embodiments of the present invention are described in detail with reference to the accompanying drawings.

However, an embodiment of the present invention may be modified in various other forms, and the scope of the present invention is limited to the following embodiments. The embodiments of the present invention are intended to fully describe the present invention to those skilled in the art. It is to be noted that the various embodiments of the present invention are different from each other, but do not need to be exclusive. For example, a specific shape, structure, and characteristic described in this specification in connection with an embodiment may be implemented into other embodiments without departing from the spirit and scope of the present invention.

Furthermore, when it is said that one element "includes" the other element, the word "include" will be understood to imply the inclusion of stated elements but not the exclusion of any other elements, unless explicitly described to the contrary.

Prior to a description of a method and apparatus for driving a piezo actuator according to embodiments of the present invention, an example of a piezo actuator driven by the method and apparatus for driving a piezo actuator is described with reference to FIGS. 1 to 3.

Figure 1:
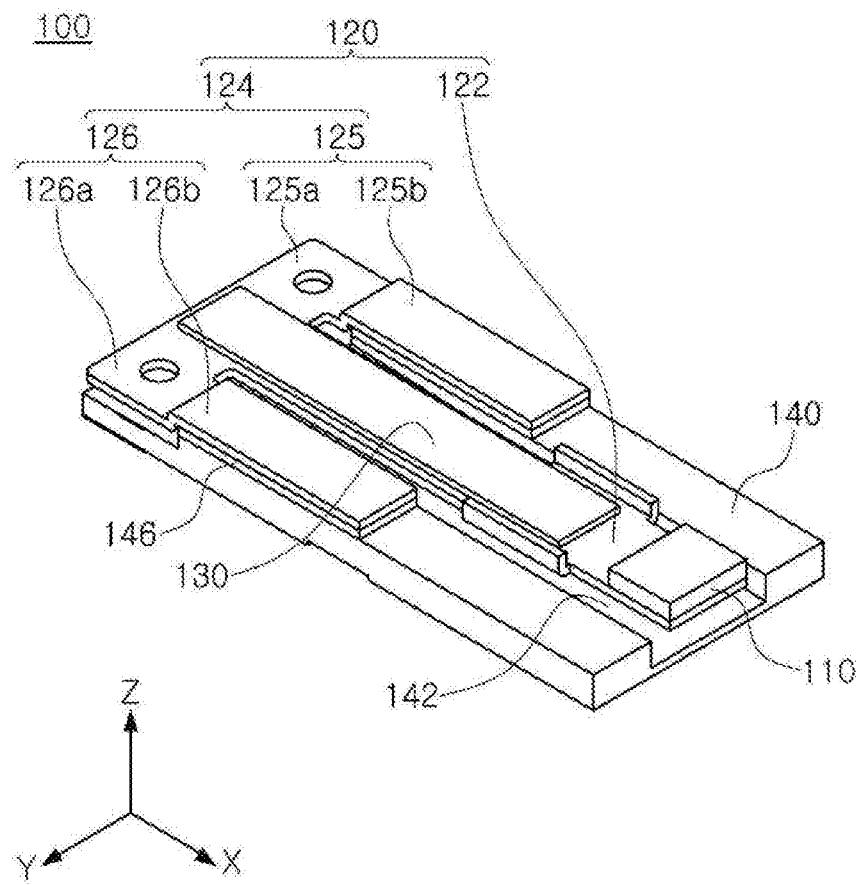
FIG. 1 is a schematic perspective view showing a piezo actuator according to an embodiment of the present invention.

FIG. 1 is a schematic perspective view showing an example of a piezo actuator driven by a method and apparatus for driving a piezo actuator according to embodiments of the present invention.

Referring to FIG. 1, a vibrator 100 according to an embodiment of the present invention may be configured to include a housing (not shown), a vibration member 120, a piezoelectric element 130, and a weight body 140, for example.

The housing has an internal space in which the vibration member 120, the piezoelectric element 130, and the weight body 140 are disposed, and may include an installation member 110 for installing the vibration member 120. The installation member 110 may have a rectangular parallelepiped block shape.

In this case, terms "length", "width" and "thickness" are defined. The length means an X direction in FIG. 1, the width means a Y direction in FIG. 1, and the thickness means a Z direction in FIG. 1.

The vibration member 120 has one end fixed and installed on the housing. For example, the vibration member 120 has one end fixed and installed on the installation member 110 of the housing. That is, the vibration member 120 may be installed on the housing in such a way as to have a cantilever structure.

Furthermore, the vibration member 120 has a shape in which the vibration member 120 is vibrated in response to a vibration mode. This is described in detail later with reference to FIGS. 2 and 3.

The vibration member 120 includes an installation unit 122 on which the piezoelectric element 130 is installed and an extension unit 124 extended from at least one side of the installation unit 122.

The installation unit 122 has one end fixed and installed on the installation member 110. The piezoelectric element 130 may be fixed and installed on one side of the installation unit 122.

The installation unit 122 means a portion to which the piezoelectric element 130 is bonded and installed, and may have a rectangular plate shape. For example, the installation unit 122 may have a shape corresponding to the piezoelectric element 130.

The extension unit 124 may include a first extension unit 125 extended from one side of the installation unit 122 and a second extension unit 126 extended from the other side of the installation unit 122. For example, the extension unit 124 may have shapes that are symmetrical to each other based on the central line of the length direction of the installation unit 122. In other words, the extension unit 124 may be extended from both sides of the installation unit 122. For example, as shown in FIG. 1, the extension unit 124 may be extended from both sides of the other end of the installation unit 122.

The first extension unit 125 includes a first width direction extension plate 125a extended from one side of the other end of the installation unit 122 and a first length direction extension plate 125b extended from the end of the first width direction extension plate 125a and extended in the length direction of the installation unit 122.

Furthermore, the second extension unit 126 includes a second width direction extension plate 126a extended from the other side of the other end of the installation unit 122 and a second length direction extension plate 126b extended from the end of the second width direction extension plate 126a in parallel to the first length direction extension plate 125b.

The first and the second length direction extension plates 125b and 126b may be formed to have a step. For example, the first and the second length direction extension plates 125b and 126b may be formed to have a step.

Furthermore, the vibration member 120 is vibrated by the deformation of the piezoelectric element 130, and the vibration state of the vibration member 120 may be changed in response to a vibration mode. For example, the vibration mode may include a first vibration mode and a second vibration mode. In the first vibration mode, the vibration member 120 is vibrated at a first resonant frequency. In the second vibration mode, the vibration member 120 is vibrated at a second resonant frequency.

In the case of the first vibration mode in which the vibration member 120 is vibrated at the first resonant frequency, the other end of the installation unit 122 from which the extension unit 124 is extended may be vibrated to the highest degree.

In the case of the second vibration mode in which the vibration member 120 is vibrated at the second resonant frequency, a portion where the vibration member 120 is vibrated to the highest degree (i.e., a maximum displacement portion) may be the ends of the first and the second length direction extension plates 125b and 126b.

Vibration may be implemented in the first and the second vibration modes through the vibration member 170 including the installation unit 122 and the extension unit 124 as described above.

The piezoelectric element 130 is fixed and installed on the vibration member 120. For example, the piezoelectric element 130 may be fixed and installed on one side of the installation unit 122 of the vibration member 120, and may have a bar shape.

The piezoelectric element 130 is connected to a circuit board (not shown), and enables the vibration member 120 and the weight body 140 to be vibrated in the plurality of vibration modes. For example, the vibration member 120 and the weight body 140 may be vibrated in the plurality of vibration modes in response to the resonant frequency of a driving signal to drive the piezoelectric element 130.

The weight body 140 is fixed and installed on the vibration member 120. For example, the weight body 140 may be installed on one side of the vibration member 120. For example, the weight body 140 may approximately have a rectangular parallelepiped shape.

Furthermore, the weight body 140 is bonded to the first and the second length direction extension plates 125b and 126b and fixed and installed on the vibration member 120. For example, the weight body 140 may be bonded to the first and the second length direction extension plates 125b and 126b through the medium of adhesive members 146.

As described above, an insertion groove 142 into which the installation unit 122 is inserted is formed on one side of the weight body 140. The weighty body 140 is bonded to the first and the second length direction extension plates 125b and 126b in portions disposed to face the first and the second length direction extension plates 125b and 126b, and is spaced apart from the vibration member 120 in the remaining portions.

FIGS. and 3 are schematic perspective views showing the operation of the vibration member of the piezo actuator of FIG. 1. FIG. 2 is an operation diagram for illustrating an example in which the vibration member according to an embodiment of the present invention is driven in the first vibration mode. FIG. 3 is an operation diagram for illustrating an example in which the vibration member according to an embodiment of the present invention is driven in the second vibration mode.

Figure 2:
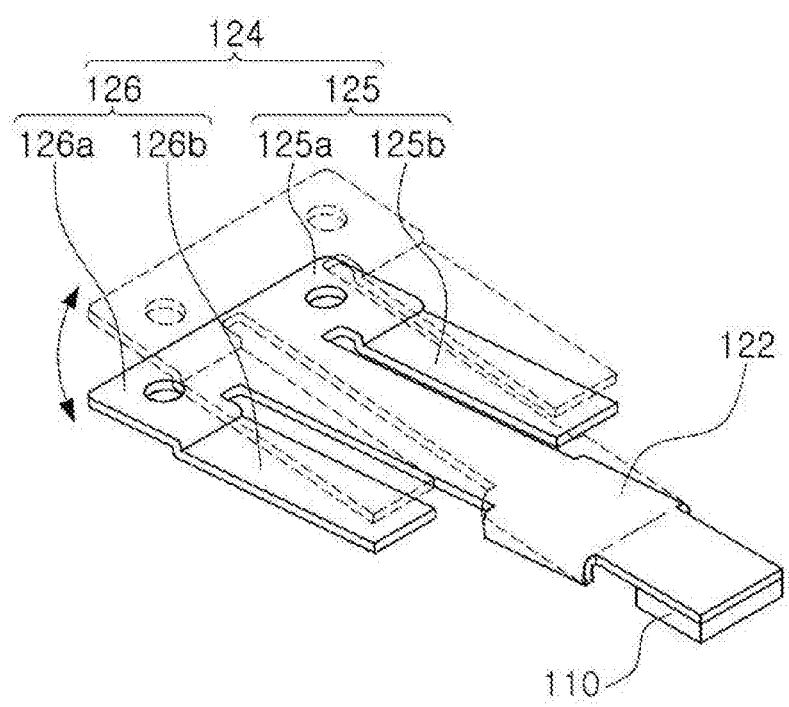
FIGS. 2 and 3 are schematic perspective views showing the operation of the vibration member of the piezo actuator of FIG. 1.

Referring to FIG. 2, one end of the installation unit 122 is fixed and installed on the installation member 110, and thus the vibration member 120 has a cantilever structure. When the vibration member 120 is vibrated in the first vibration mode by the piezoelectric element 130 (refer to FIG. 1), the vibration member 120 is vibrated up and down in the state in which one end of the installation unit 122 of the vibration member 120 has been fixed.

As shown in FIG. 2, in the first vibration mode, the other end of the installation unit 122 from which the extension unit 124 is extended may be vibrated to the highest degree.

Furthermore, referring to FIG. 2 when the vibration member 120 is vibrated in the second vibration mode by the piezoelectric element 130 (refer to FIG. 1), the extension unit 124 is vibrated up and down greater than the installation unit 122. The ends of the first and the second length direction extension plates 125b and 126b may be vibrated to the highest degree.

As described above, the vibration member 120 may be vibrated in the first and the second vibration modes through the vibration member 120 including the installation unit 122 and the extension unit 124.

A difference between the first resonant frequency and the second resonant frequency may be 50 Hz or more. Furthermore, the first resonant frequency in the first vibration mode and the second resonant frequency in the second vibration mode may be with a range of 50 Hz~400 Hz. Furthermore, it is hereinafter assumed that the first resonant frequency is lower than the second resonant frequency.

Figure 3:
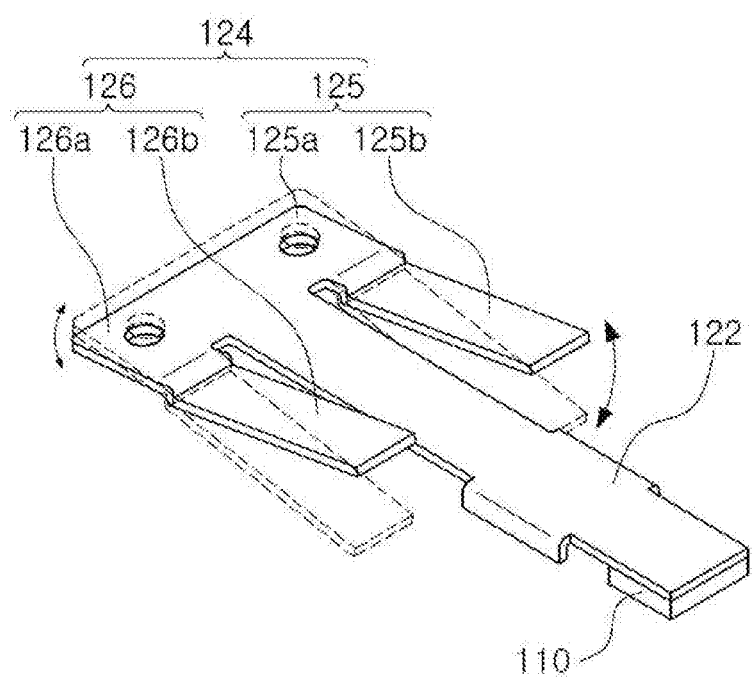

The piezo actuator described with reference to FIGS. 1 to 3 is only an example for illustrating a method and apparatus for driving a piezo actuator according to embodiments of the present invention, and the scope of the present invention is not limited to the above description. That is, a method and apparatus for driving a piezo actuator according to embodiments of the present invention may be applied to any piezo actuator vibrated in the plurality of vibration modes.

Figure 4:
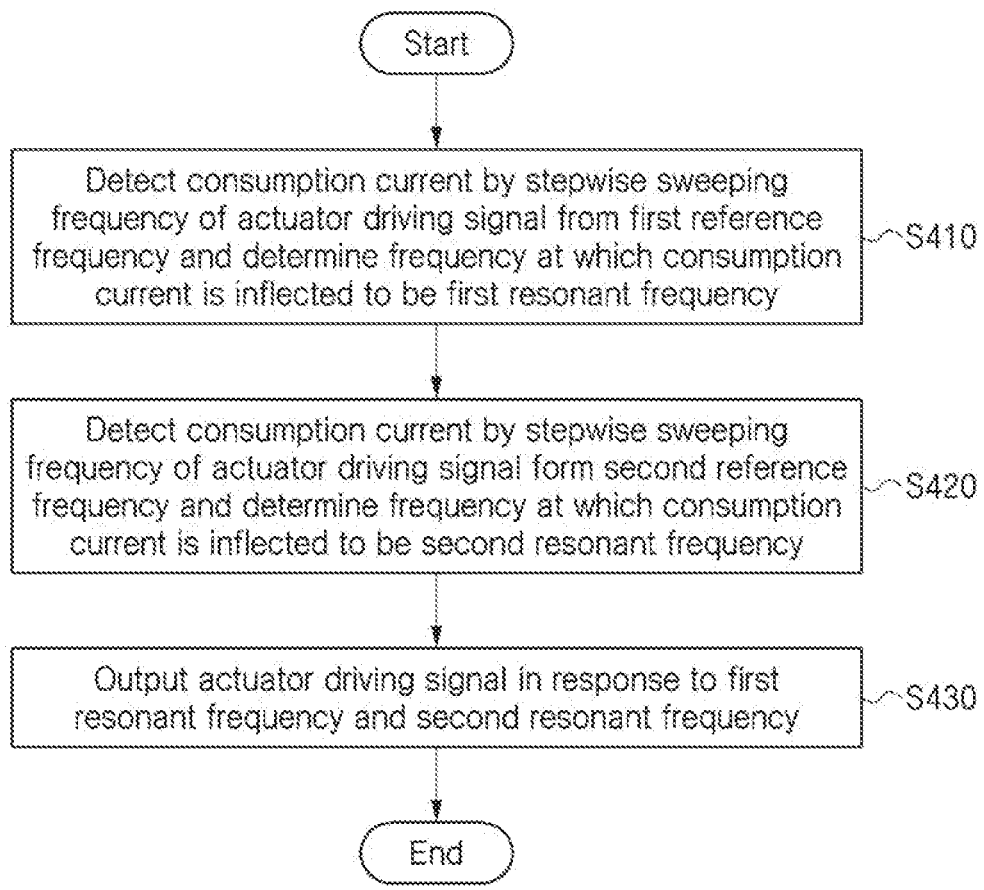
FIG. 4 is a flowchart illustrating a method for driving the piezo actuator according to an embodiment of the present invention.

FIG. 4 is a flowchart illustrating a method for driving the piezo actuator according to an embodiment of the present invention. Referring to FIG. 4, the method for driving the piezo actuator according to an embodiment of the present invention may be basically divided into three steps.

Consumption current may be detected by stepwise sweeping the frequency of an actuator driving signal to drive the piezo actuator in response to the plurality of vibration modes from a first reference frequency, and a frequency at which the consumption current is inflected may be determined to be the first resonant frequency at step S410.

Next, consumption current may be detected by stepwise sweeping the frequency of the actuator driving signal form a second reference frequency, and a frequency at which the consumption current inflected may be determined to be the second resonant frequency at step S420.

Furthermore, at the step S410 of determining the first resonant frequency and the step S420 of determining the second resonant frequency, the frequency of the actuator driving signal may be stepwise swept within a range of 40 Hz to 50 Hz.

At the step S410 of determining the first resonant frequency and the step S420 of determining the second resonant frequency, the frequency of the actuator driving signal is stepwise swept from a low frequency to a high frequency, and a frequency at which the consumption current has dropped may be determined to be the first resonant frequency and the second resonant frequency. Furthermore, the frequency of the actuator driving signal is stepwise swept from a high frequency to a low frequency, and a frequency at which the consumption current has risen may be determined to be the first resonant frequency and the second resonant frequency.

After the first resonant frequency and the second resonant frequency are determined, an actuator driving signal may be output in response to the first resonant frequency and the second resonant frequency at step S430.

If the piezo actuator has a plurality of three or more vibration modes, in order to determine another resonant frequency after the first resonant frequency and the second resonant frequency are determined, a step of detecting consumption current by stepwise sweeping the frequency of an actuator driving signal from a reference frequency may be repeated. An actuator driving signal may be output in response to the first resonant frequency, the second resonant frequency, and another resonant frequency.

Accordingly, method for driving a piezo actuator according to an embodiment of the present invention has an advantage in that the piezo actuator can be driven to provide a sufficient vibration power because a resonant frequency depending on a plurality of vibration modes is determined.

Figure 5:
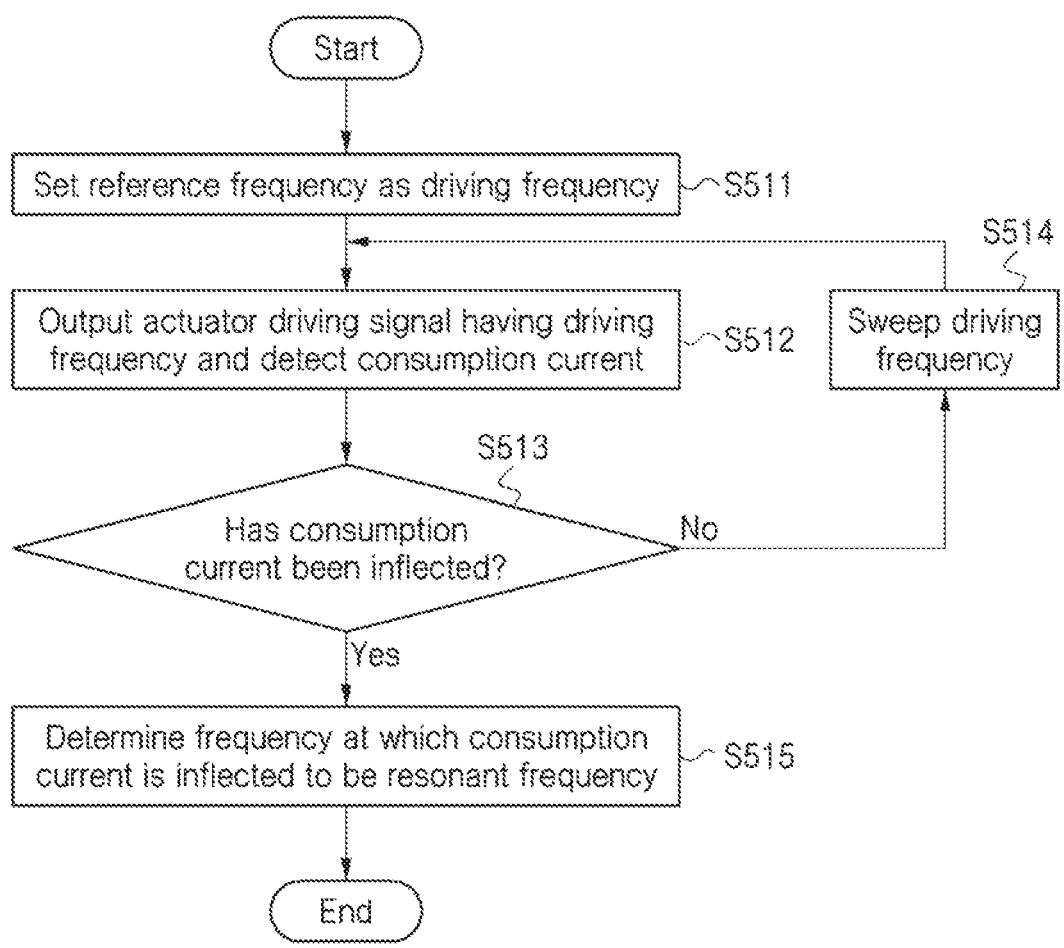
FIG. 5 is a flowchart illustrating a frequency determination step in the method for driving the piezo actuator according to an embodiment of the present invention.

FIG. 5 is a flowchart illustrating a frequency determination step in the method for driving the piezo actuator according to an embodiment of the present invention.

Each of the step S410 of determining the first resonant frequency, the step S420 of determining the second resonant frequency, and the step determining another resonant frequency, which have been described with reference to FIG. 4, is performed according to the flowchart of FIG. 5 and is described below.

First, a reference frequency may be set as a driving frequency at step S511. An actuator driving signal having the driving frequency may be output, and consumption current may be detected at step S512.

Whether the consumption current has been inflected may be determined at step S513. If, as a result of the determination, it is determined that the consumption current has not been inflected, the driving frequency may be stepwise swept at step S514.

If it is determined that consumption current has been inflected after the step S513 of determining whether consumption current has been inflected, the step S514 of sweeping the driving frequency, and the step S512 of detecting consumption current are repeated, a frequency at which the consumption current is inflected may be determined to be a resonant frequency at step S515.

Figure 6:
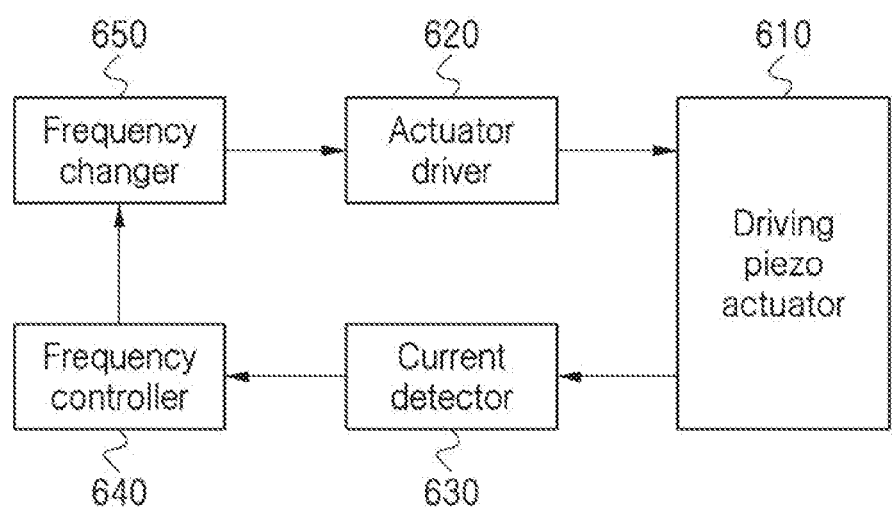
FIG. 6 is a block diagram of an apparatus for driving a piezo actuator according to an embodiment of the present invention.

FIG. 6 is a block diagram of the apparatus for driving a piezo actuator according to an embodiment of the present invention. The apparatus for driving a piezo actuator according to an embodiment of the present invention may include an actuator driver 620 for driving a piezo actuator 610, a current detector 630, a frequency controller 640, and a frequency changer 650.

The actuator driver 620 may drive the piezo actuator 610 by outputting an actuator driving signal. The current detector 630 may detect the consumption current of the actuator driver 620.

The frequency controller 640 may receive consumption current information from the current detector 630, may determine the first resonant frequency and the second resonant frequency based on a frequency at which the consumption current is inflected, and may output a frequency control signal. Furthermore, the frequency controller 640 may determine a resonant frequency other than the first resonant frequency and the second resonant frequency.

The frequency controller 640 may be implemented by a combination of hardware, such as a microprocessor, and software mounted on the hardware and programmed to execute a predetermined operation.

More specifically, the frequency controller 640 may output a frequency control signal so that the frequency of an actuator driving signal is stepwise swept from the first reference frequency and the second reference frequency in order to determine the first resonant frequency and the second resonant frequency.

Furthermore, the frequency controller 640 may output the frequency control signal so that the frequency of the actuator driving signal is stepwise swept within a range of 40 Hz to 50 Hz.

The frequency controller 640 may output the frequency control signal so that the frequency of the actuator driving signal is stepwise swept from a low frequency to a high frequency, and may determine the first resonant frequency and the second resonant frequency based on a frequency at which consumption current has dropped. Furthermore, the frequency controller 640 may output the frequency control signal so that the frequency of the actuator driving signal is stepwise swept from a high frequency to a low frequency, and may determine the first resonant frequency and the second resonant frequency based on a frequency at which consumption current has risen.

Accordingly, the apparatus for driving a piezo actuator according to an embodiment of the present invention can determine an accurate resonant frequency even in a process distribution and temperature distribution and can provide a sufficient vibration power by driving the piezo actuator in response to a plurality of resonant frequencies.

Figure 7:
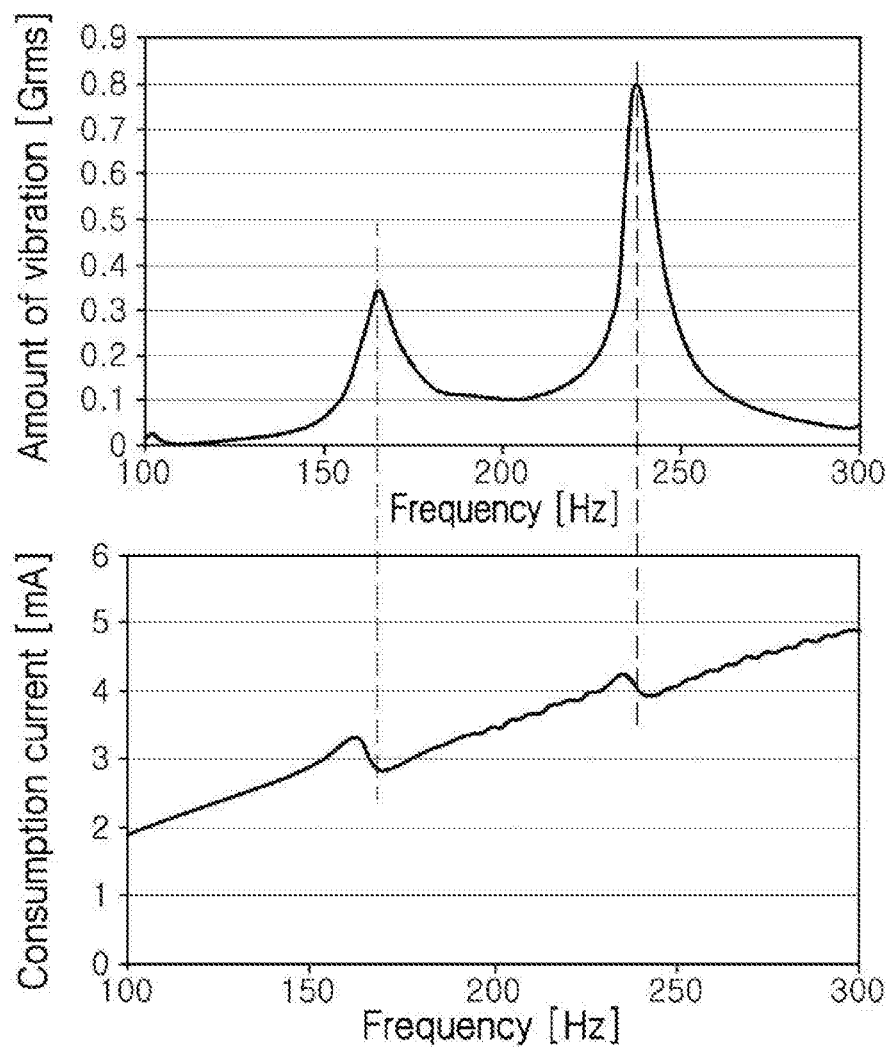
FIG. 7 is a graph showing the amount of vibration of the piezo actuator and consumption current depending on frequency sweep according to an embodiment of the present invention.

FIG. 7 is a graph showing the amount of vibration of the piezo actuator and consumption current depending on frequency sweep according to an embodiment of the present invention.

From a graph on the lower side of FIG. 7, it may be seen that consumption current was changed at approximately 160 Hz and 240 Hz in response to frequency sweep. In the method for driving a piezo actuator according to an embodiment of the present invention, a frequency at which consumption current is inflected may be determined to be resonant frequency.

From FIG. 7, it may be seen that the amount of vibration (Grms) of the piezo actuator is relatively high if the frequency of an actuator driving signal is a frequency determined to be a resonant frequency.

The method and apparatus for driving a piezo actuator according to the embodiments of the present invention has an advantage in that the piezo actuator can be driven to provide sufficient vibration power because a resonant frequency depending on a plurality of vibration modes is determined.

Although the present invention has been described in connection with specific contents, such as the detailed elements, and the limited embodiments and drawings, the specific contents and the limited embodiments and drawings have been provided only to help general understanding the present invention, and the present invention is not limited to the embodiments. Those skilled in the art to which the present invention pertains may modify the present invention in various ways from the above description.

Accordingly, the spirit of the present invention should not be limited to the aforementioned embodiments, and the claims and all things equally or equivalently modified from the claims should be construed as belonging to the category of the spirit of the present invention.

What is claimed is:

1. A method for driving a piezo actuator, which is performed by an apparatus for driving the piezo actuator, the method comprising:
   detecting consumption current while stepwise sweeping a frequency of an actuator driving signal from a first reference frequency and determining that a first frequency at which the consumption current is inflected is a first resonant frequency;
   detecting consumption current while stepwise sweeping the frequency of the actuator driving signal from a second reference frequency and determining that a second frequency at which the consumption current is inflected is a second resonant frequency; and
   outputting actuator driving signals in response to the first resonant frequency and the second resonant frequency, wherein the actuator driving signals are used to drive the piezo actuator in first and second vibration modes,
   wherein the piezo actuator vibrates at the first resonant frequency in the first vibration mode, and the piezo actuator vibrates at the second resonant frequency in the second vibration mode, the first resonant frequency being different from the second resonant frequency.

2. The method of claim 1, wherein the stepwise sweeping comprises stepwise sweeping the frequency of the actuator driving signal by a range of 40 Hz to 50 Hz.

3. The method of claim 1, wherein the determining the first resonant frequency and the determining the second resonant frequency comprise:
   stepwise sweeping the frequency of the actuator driving signal from a low frequency to a high frequency, and determining that a first frequency and a second frequency at which the consumption current has dropped are the first resonant frequency and the second resonant frequency, respectively.

4. The method of claim 1, wherein the determining the first resonant frequency and the determining the second resonant frequency comprise:
   stepwise sweeping the frequency of the actuator driving signal from a high frequency to a low frequency, and determining that a first frequency and a second frequency at which the consumption current has risen are the first resonant frequency and the second resonant frequency, respectively.

5. The method of claim 1, wherein the determining the first resonant frequency and the determining the second resonant frequency each comprise:
   setting a reference frequency as a driving frequency;
   outputting an actuator driving signal having the driving frequency and detecting consumption current;
   repeatedly detecting the consumption current while stepwise sweeping the driving frequency until inflected consumption current is detected; and
   determining that a frequency at which the consumption current is inflected is a resonant frequency and storing the determined resonant frequency.

6. An apparatus for driving a piezo actuator, comprising:
   a piezo actuator deformed in response to first and second vibration modes;
   an actuator driver configured to output an actuator driving signal to drive the piezo actuator;
   a current detector configured to detect consumption current of the actuator driver;
   a frequency controller configured to:
      determine a first resonant frequency and a second resonant frequency based respectively on a first frequency and a second frequency at which the consumption current is inflected, and
      output a frequency control signal so that a frequency of the actuator driving signal is stepwise swept from a first reference frequency and a second reference frequency to thereby determine the first resonant frequency and the second resonant frequency; and a frequency changer configured to output a driving control signal to the actuator driver in response to the frequency control signal, wherein the piezo actuator vibrates at the first resonant frequency in the first vibration mode, and the piezo actuator vibrates at the second resonant frequency in the second vibration mode, the first resonant frequency being different from the second resonant frequency.

7. The apparatus of claim 6, wherein the frequency controller outputs the frequency control signal so that the frequency of the actuator driving signal is stepwise swept by a range of 40 Hz to 50 Hz.

8. The apparatus of claim 6, wherein the frequency controller outputs the frequency control signal so that the frequency of the actuator driving signal is stepwise swept from a low frequency to a high frequency, and determines the first resonant frequency and the second resonant frequency based on frequencies at which the consumption current has dropped.

9. The apparatus of claim 6, wherein the frequency controller outputs the frequency control signal so that the frequency of the actuator driving signal is stepwise swept from a high frequency to a low frequency, and determines the first resonant frequency and the second resonant frequency based on frequencies at which the consumption current has risen.

* * * * *